(12) United States Patent
Pan et al.

(10) Patent No.: US 10,626,519 B2
(45) Date of Patent: Apr. 21, 2020

(54) LEAD OXYCHLORIDE, INFRARED NONLINEAR OPTICAL CRYSTAL, AND PREPARATION METHOD THEREOF

(71) Applicant: XINJIANG TECHNICAL INSTITUTE OF PHYSICS & CHEMISTRY, CHINESE ACADEMY OF SCIENCES, Urumqi (CN)

(72) Inventors: Shilie Pan, Urumqi (CN); Hui Zhang, Urumqi (CN); Min Zhang, Urumqi (CN)

(73) Assignee: XINJIANG TECHNICAL INSTITUTE OF PHYSICS & CHEMISTRY, CHINESE ACADEMY OF SCIENCES, Urumoi (CN)

( * ) Notice: Subject to any disclaimer, the term of this patent is extended or adjusted under 35 U.S.C. 154(b) by 0 days.

(21) Appl. No.: 15/744,077

(22) PCT Filed: Dec. 30, 2015

(86) PCT No.: PCT/CN2015/099754
§ 371 (c)(1),
(2) Date: Jan. 12, 2018

(87) PCT Pub. No.: WO2017/045310
PCT Pub. Date: Mar. 23, 2017

(65) Prior Publication Data
US 2018/0202069 A1 Jul. 19, 2018

(30) Foreign Application Priority Data

Sep. 19, 2015 (CN) .......................... 2015 1 0599729

(51) Int. Cl.
| | |
|---|---|
| *C30B 29/12* | (2006.01) |
| *C30B 11/00* | (2006.01) |
| *C30B 15/00* | (2006.01) |
| *C30B 29/22* | (2006.01) |
| *C01G 21/00* | (2006.01) |
| *C30B 9/12* | (2006.01) |
| *C30B 19/12* | (2006.01) |
| *C30B 15/20* | (2006.01) |
| *C30B 19/04* | (2006.01) |
| *C30B 19/02* | (2006.01) |
| *C30B 9/06* | (2006.01) |
| *C30B 9/08* | (2006.01) |
| *C30B 11/14* | (2006.01) |
| *C30B 15/36* | (2006.01) |
| *C30B 17/00* | (2006.01) |
| *G02F 1/355* | (2006.01) |

(52) U.S. Cl.
CPC .............. *C30B 29/12* (2013.01); *C01G 21/00* (2013.01); *C01G 21/006* (2013.01); *C30B 9/06* (2013.01); *C30B 9/08* (2013.01); *C30B 9/12* (2013.01); *C30B 11/00* (2013.01); *C30B 11/14* (2013.01); *C30B 15/00* (2013.01); *C30B 15/203* (2013.01); *C30B 15/36* (2013.01); *C30B 17/00* (2013.01); *C30B 19/02* (2013.01); *C30B 19/04* (2013.01); *C30B 19/12* (2013.01); *C30B 29/22* (2013.01); *G02F 1/3551* (2013.01); *C01P 2002/72* (2013.01); *C01P 2002/76* (2013.01); *C01P 2002/77* (2013.01); *C01P 2004/01* (2013.01); *G02F 2203/11* (2013.01)

(58) Field of Classification Search
CPC combination set(s) only.
See application file for complete search history.

(56) References Cited

FOREIGN PATENT DOCUMENTS

| | | |
|---|---|---|
| CN | 102191544 A | 9/2011 |
| CN | 102633239 A | 8/2012 |
| CN | 104213194 A | 12/2014 |
| CN | 104562196 A | 4/2015 |
| CN | 104651933 A | 5/2015 |
| CN | 105621361 A | 6/2016 |

OTHER PUBLICATIONS

Doklady Physical Chemisrty, 2007, vol. 414, Part 2, pp. 128-131, Strucutre and Mechanism of the Ionic Conductivity of the Nonstoichometric Compound Pb2+xOCl2+2x, Siidra et al.*
O. I. Siidra, Structure and Mechanism of the Ionic Conductivity of the Nonstoichiometric Compound Pb2+x OCl2+2x, Doklady Physical Chemistry, 2007, ISSN 0012-5016, vol. 414, Part 2, pp. 128-131.
Guy Perrault et. al, Étude cristallographique de deux oxychlorures de plomb synthétiques : Pb3O2Cl2 et Pb2O Cl2, Bulletin de la Société française de Minéralogie et de Cristallographie, year 1971, vol. 94, p. 108-112.

* cited by examiner

*Primary Examiner* — Monique R Peets
(74) *Attorney, Agent, or Firm* — Bayramoglu Law Offices LLC (57) ABSTRACT

An oxychloride infrared nonlinear optical crystal and the preparation method and use thereof, the optical crystal has a general chemical formula of $Pb_{2+x}OCl_{2+2x}$, therein $0<x<0.139$ or $0.141<x<0.159$ or $0.161<x\leq0.6$. The crystal is non-centrosymmetric, belongs to orthonormal system with space group of Fmm2, cell parameter is $a=35.4963(14)\pm0.05$ Å, $b=5.8320(2)\pm0.05$ Å, $c=16.0912(6)\pm0.05$ Å. The crystal is prepared by high temperature melt method or flux method. The crystal has a strong second harmonic generation efficiency of 4 times that of KDP ($KH_2PO_4$) tested by Kurtz method, it is phase machable, transparent in the range of 0.34-7 μm. The laser damage threshold is 10 times that of the current commercial infrared nonlinear optical crystal $AgGaS_2$. No crystalline water exists in lead oxychloride, and it is stable in the air and has good thermal stability.

7 Claims, 2 Drawing Sheets

LEAD OXYCHLORIDE, INFRARED NONLINEAR OPTICAL CRYSTAL, AND PREPARATION METHOD THEREOF

CROSS REFERENCE TO RELATED APPLICATIONS

This application is the national phase entry of International Application No. PCT/CN2015/099754, filed on Dec. 30, 2015, which claims priority from the Chinese patent application no. 201510599729.X filed on Sep. 19, 2015, the entire contents of which are incorporated herein by reference.

TECHNICAL FIELD

The present invention relates to an infrared nonlinear optical crystal lead oxychloride, and its preparation method and application thereof, a general formula of the optical crystal is $Pb_{2+x}OCl_{2+2x}$, therein $0<x<0.139$ or $0.141<x<0.159$ or $0.161<x\leq0.6$.

BACKGROUND

The nonlinear optical effect originates from the interaction between the laser and the medium. When the laser propagates in a medium with a non-zero second order polarizability, the nonlinear optical effects such as frequency doubling, sum frequency, difference frequency and optical parametric amplification will be produced. Based on the second order nonlinear optical effects, the crystals can be made as second harmonic generator, frequency converter, optical parametric oscillator and nonlinear optical devices, etc. and have important application in many fields, such as laser technology, atmospheric monitoring, national defense and military, etc. Inorganic nonlinear optical materials are dominant in the practical research of the second order nonlinear optical materials. According to the transmittance and application wavelength, the inorganic nonlinear optical crystal materials can be divided into ultraviolet nonlinear optical material, visible nonlinear optical material and infrared nonlinear optical material. The practically applied inorganic nonlinear optical materials in ultraviolet and visible light utility are BBO ($\beta$-$BaB_2O_4$), LBO ($LiB_3O_5$), KDP ($KH_2PO_4$), KTP ($KTiOPO_4$), etc., they can meet the basic requirements of the most situation. However, for the infrared nonlinear optical materials, there is still far from practicality. The reason are as follows: although the existing infrared nonlinear optical materials, such as $AgGaS_2$, $AgGaSe_2$, has large second order nonlinear optical coefficient and have a wide transmittance ranges in the infrared region, the harsh reaction conditions, difficult to grow single crystals with high quality, especially the low damage threshold, result in the unsuitable utilities in nonlinear optical crystal materials. The realization of the frequency conversion in infrared region is of great value in the national economy, national defense and other fields. In 2003, the book titled as "nonlinear optical crystal materials science" published by Science Press (China) proposed that "Infrared nonlinear optical crystal is underdeveloped in the whole spectral band of nonlinear optics, therefore, the researches of novel nonlinear optical materials in infrared needs to be strengthened". Hence, it is a difficult and hot spot to find new high efficiency infrared nonlinear optical materials with high laser damage threshold and large nonlinear optical coefficient. In 2007, O. I. Siidra, et al reported the $Pb_{2.16}OCl_{2.32}$ with the space group of Fd2d and the cell parameter of a=5.829(3) Å, b=16.056(6) Å, c=35.528(15) Å (Doklady Physical Chemistry, 2007, Vol. 414, Part 2, pp. 128-131.). The space group and the cell parameters of the compound are different from that described in the present invention. In 2014, invention patent titled as "compounds and lead oxychloride infrared nonlinear optical crystal and preparation method and use thereof" (Patent No.: ZL 201410626434.2) was authorized by Xinjiang Academy of Sciences Institute, Chinese Academy of Sciences. Therein, the invention reported $Pb_{2.14}OCl_{2.28}$ compounds. the present invention was further systematic research based on $Pb_{2.14}OCl_{2.28}$ and the obtained infrared nonlinear optical materials have a general formula of $Pb_{2+x}OCl_{2+2x}$, therein $0<x<0.139$ or $0.141<x<0.159$ or $0.161<x\leq0.6$. Because of the obvious evaporation will lead to the component deviation in Pb—O—Cl system during the crystal growth, the optical crystal with general formula $Pb_{2+x}OCl_{2+2x}$ presented in this invention is more universal and practical than $Pb_{2.14}OCl_{2.28}$.

SUMMARY

One object of the present invention is to provide a lead oxychloride infrared nonlinear optical crystal, wherein the crystal has a general formula of $Pb_{2+x}OCl_{2+2x}$, and $0<x<0.139$ or $0.141<x<0.159$ or $0.161<x\leq0.6$, and the crystal has no symmetric center, belongs to orthonormal system with space group of Fmm2, and cell parameter is a=35.4963(14)±0.05 Å, b=5.8320(2)±0.05 Å, c=16.0912(6)±0.05 Å.

Another object of the present invention is to provide the preparation method of lead oxychloride infrared nonlinear optical crystal.

Yet another object of the present invention is to provide oxychloride infrared nonlinear optical devices has important application value in laser frequency conversion, electro-optic modulation, photorefractive information processing, optical lens and other high-tech fields, and use thereof for preparing the second harmonic generator, the up frequency converter, the down frequency convertor or the optical parametric oscillator.

The lead oxychloride infrared nonlinear optical crystal provided by the present invention has a general formula of $Pb_{2+x}OCl_{2+2x}$, and $0<x<0.139$ or $0.141<x<0.159$ or $0.161<x\leq0.6$, the crystal is noncentrosymmetric, belongs to orthonormal system with space group of Fmm2, cell parameter is a=35.4963(14)±0.05 Å, b=5.8320(2)±0.05 Å, c=16.0912(6)±0.05 Å.

The preparation method of lead oxychloride infrared nonlinear optical crystal provided by the present invention is using solid state reaction method to synthesize the compound at first, and then high temperature melt method or flux method is used to grow the crystal. The specific operation is carried out according to the following steps:

a. $PbCl_2$ and PbO, $Pb(CO_3)_2$ or $Pb(NO_3)_2$ are placed into a mortar, and careful mixed and grinded, and then transferred into an $Al_2O_3$ crucible with the size of Φ400 mm×400 mm, and the crucible is pressed and put into a muffle furnace, slowly heated to 300° C., kept at this temperature for 24 hours, after cooled to room temperature, the mixture is loose in this moment, and then grinded uniformly, then placed into a crucible and put into a muffle furnace to 430° C. and kept for 48 hours, then grinded to obtain a compound of lead oxychloride, which is identified by X-ray diffraction;

b. melting the lead oxychloride compounds obtained in step a in the crucible, heating to 450-650° C., and keeping 5-80 hours, and obtaining the mixed melt of lead oxychloride;

or fluxes of $PbCl_2$ or PbO is introduced into the lead oxychloride compounds obtained in step a, and the resulted mixture is heated to 450-650° C., and kept for 5-80 hours, and obtain a solution of lead chlorate and fluxes, therein the molar ratio of lead chlorate and fluxes is 1:0.1-2;

c. preparing a lead oxychloride seed crystal: a part of the mixed melting melt or solution as obtained in step b is slowly cooled to room temperature at a rate of 0.5-10° C./h to obtain a lead oxychloride seed crystal by spontaneous crystallization;

d. a crucible containing the mixed melt or solution as obtained in step b is placed into a crystal growth furnace, and the seed crystal obtained in step c is attached on a crystal rod, and a seed crystal into the crystal growing furnace from the top, and preheated the seed crystal for 5-60 minutes, introduced the seed crystal to contact the solution surface of the mixed melting solution or into the mixed melt for remelting, and kept at the temperature for 5-60 minutes, and cooled to 350-510° C. at a speed of 1-60° C./h.

e. the mixture is cooled at a speed of 0.1-5° C./day while the crystal rod is being rotated at a rate of 0~60 rpm for growing crystal, the crystal is drawn out from the surface of the mixed melting solution when a desired size single crystal is obtained, and cooled to room temperature at a rate of 1~80° C./h, and taken from the furnace to obtain a lead oxychloride infrared nonlinear optical crystal.

The melt crystal growth method provided by the present invention, including Czochralski method, kyropoulos method or Bridgman method.

A use of oxychloride infrared nonlinear optical crystal provided by the present invention for preparing the second harmonic generator, the up frequency converter, a down frequency convertor or the optical parametric oscillator.

The lead oxychloride infrared nonlinear optical crystal provided by the present invention has a second harmonic generation response of about 4 times that of $KH_2PO_4$, can realize phase matching, has high transparency in 0.34-7 μm, thermal decomposition temperature is 500° C.

The lead oxychloride infrared nonlinear optical crystal provided by the present invention has important application value in laser frequency conversion, electro-optic modulation, photorefractive information processing, optical lens and other high-tech fields, and use thereof for preparing the second harmonic generator, the up frequency converter, the down frequency convertor or the optical parametric oscillator.

Compared with the existing technology, the present invention has the following advantages:

(1) strong phase-matching second harmonic generation response, second harmonic generation test show that the powder second harmonic generation effect of lead oxychloride is 4 times that of KDP ($KH_2PO_4$) via Kurtz method, and it has high transparency in 0.34-7 μm;

(2) the laser damage threshold is 10 times that of the current commercial infrared nonlinear optical crystal $AgGaS_2$.

(3) the large size single crystal can be produced in the open system. The preparation method is simple, the growth time is short, the experimental conditions are mild and the purity of the product is high.

(4) no crystalline water exist in lead oxychloride, and it is stable in the air and has good thermal stability.

DETAILED DESCRIPTION OF THE INVENTION

The present invention will be described in detail with reference to the drawing and examples below:

EXAMPLES

Example 1

Growing the crystal by the Czochralski method from the stoichiometric melt.

Preparing of $Pb_{2+x}OCl_{2+2x}$ (x=0.1) compound via solid reaction method according to the following reaction equation:

$1.1PbCl_2+PbO \rightarrow Pb_{2.1}OCl_{2.2}$ $PbCl_2$ and PbO were put in a mortar at a molar ratio of 1.1:1, mixed and ground carefully, and then transferred into a Φ400 mm×400 mm lidless corundum crucible and press it tight. The crucible was placed in a muffle furnace, slowly heated to 300° C., and kept at this temperature for 24 hours, after cooling to room temperature, the mixture was loose in this moment, and then mixed and ground the sample uniformly, then placed into the crucible and loaded into a muffle furnace to 430° C. and kept 48 hours, then grounded to obtain the compound of lead oxychloride, the product was analyzed using X-ray diffraction Growing the $Pb_{2.1}OCl_{2.2}$ crystal by the Czochralski method from the stoichiometric melt:

The obtained $Pb_{2.1}OCl_{2.2}$ compounds were transferred into a Φ100 mm×100 mm lidless platinum crucible, heating to 650° C., and kept 5 hours, and obtained the mixed melt of lead oxychloride;

Preparing a lead oxychloride seed crystal: a part of the mixed melting melt as obtained was slowly cooled to room temperature at a rate of 10° C./h to obtain a lead oxychloride seed crystal by spontaneous crystallization;

Placed a crucible containing the mixed melt into a crystal growth furnace, attached the seed crystal on a crystal rod, introduced the seed crystal into the crystal growing furnace from the top, preheated the seed crystal for 5 minutes, introduced the seed crystal to contact the solution surface of the mixed melting solution for remelting, kept at the temperature for 5 minutes, and cooled to 510° C. at a speed of 10° C./h;

Cooled the temperature of the mixture at a speed of 5° C./day while rotating the crystal rod at a rate of 60 rpm for growing crystal, drew the crystal at a rate of 3 mm/h, increased the drawing rate to draw the crystal out of the surface of the mixed melting solution when the crystal growth was finished, cooled to room temperature at a rate of 80° C./h, and took out the crystal from the furnace to obtain a lead oxychloride infrared nonlinear optical crystal with a size of 15 mm×13 mm×4 mm.

Example 2

Growing the crystal by the Czochralski method from the stoichiometric melt.

Preparing of $Pb_{2+x}OCl_{2+2x}$ (x=0.125) compound via solid reaction method according to the following reaction equation:

$$1.125PbCl_2+PbO \rightarrow Pb_{2.125}OCl_{2.25}$$

$PbCl_2$ and PbO were put in a mortar at a molar ratio of 1.125:1, mixed and ground carefully, and then transferred into a Φ400 mm×400 mm lidless corundum crucible and press it tight. The crucible was placed in a muffle furnace, slowly heated to 300° C., kept at this temperature for 24 hours, after cooling to room temperature, the mixture is loose in this moment, and then mixed and ground the sample uniformly, then placed into the crucible and loaded into a muffle furnace to 430° C. and kept 48 hours, then ground to obtain the compound of lead oxychloride, the product was analyzed using X-ray diffraction.

Growing the $Pb_{2.125}OCl_{2.25}$ crystal by the Czochralski method from the stoichiometric melt:

The obtained $Pb_{2.125}OCl_{2.25}$ compounds were transferred into a Φ100 mm×100 mm lidless platinum crucible, heated to 630° C., and kept 45 hours, and obtain the mixed melt of lead oxychloride;

Preparing a lead oxychloride seed crystal: a part of the mixed melting melt as obtained was slowly cooled to room temperature at a rate of 9° C./h to obtain a lead oxychloride seed crystal by spontaneous crystallization;

Placed a crucible containing the mixed melt into a crystal growth furnace, attached the seed crystal on a crystal rod, introduced the seed crystal into the crystal growing furnace from the top, preheated the seed crystal for 7 minutes, introduced the seed crystal to contact the solution surface of the mixed melting solution for remelting, kept at the temperature for 7 minutes, and cooled to 500° C. at a speed of 9° C./h;

Cooled the temperature of the mixture at a speed of 4.5° C./day while rotating the crystal rod at a rate of 48 rpm for growing crystal, drew the crystal at a rate of 2.5 mm/h, increased the drawing rate to draw the crystal out of the surface of the mixed melting solution when the crystal growth is finished, cooled to room temperature at a rate of 45° C./h, and took out the crystal from the furnace to obtain a lead oxychloride infrared nonlinear optical crystal with a size of 12 mm×10 mm×3 mm.

Example 3

Growing the crystal by the Czochralski method from the stoichiometric melt.

Preparing of $Pb_{2+x}OCl_{2+2x}$ (x=0.15) compound via solid reaction method according to the following reaction equation:

$$1.15PbCl_2+PbO \rightarrow Pb_{2.15}OCl_{2.3}$$

$PbCl_2$ and PbO were put in a mortar at a molar ratio of 1.15:1, mixed and ground carefully, and then transferred into a Φ400 mm×400 mm lidless corundum crucible and press it tight. The crucible was placed in a muffle furnace, slowly heated to 300° C., kept at this temperature for 24 hours, after cooling to room temperature, the mixture is loose in this moment, and then mixed and ground the sample uniformly, then placed into the crucible and loaded into a muffle furnace to 430° C. and kept 48 hours, then grounded to obtain the compound of lead oxychloride, the product was analyzed using X-ray diffraction.

Growing the $Pb_{2.15}OCl_{2.3}$ crystal by the Czochralski method from the stoichiometric melt:

The obtained $Pb_{2.15}OCl_{2.3}$ compounds were transferred into a Φ100 mm×100 mm lidless platinum crucible, heated to 600° C., and kept 46 hours, and obtained the mixed melt of lead oxychloride;

Preparing a lead oxychloride seed crystal: a part of the mixed melting melt as obtained was slowly cooled to room temperature at a rate of 8.5° C./h to obtain a lead oxychloride seed crystal by spontaneous crystallization;

Placed a crucible containing the mixed melt into a crystal growth furnace, attached the seed crystal on a crystal rod, introduced the seed crystal into the crystal growing furnace from the top, preheated the seed crystal for 8 minutes, introduced the seed crystal to contact the solution surface of the mixed melting solution for remelting, kept at the temperature for 8 minutes, and cooled to 495° C. at a speed of 8° C./h;

Cooled the temperature of the mixture at a speed of 4.3° C./day while rotating the crystal rod at a rate of 46 rpm for growing crystal, drew the crystal at a rate of 2.4 mm/h, increased the drawing rate to draw the crystal out of the surface of the mixed melting solution when the crystal growth was finished, cooled to room temperature at a rate of 43° C./h, and took out the crystal from the furnace to obtain a lead oxychloride infrared nonlinear optical crystal with a size of 16 mm×14 mm×5 mm.

Example 4

Growing the crystal by the Czochralski method from the stoichiometric melt.

Preparing of $Pb_{2+x}OCl_{2+2x}$ (x=0.17) compound via solid reaction method according to the following reaction equation:

$$1.17PbCl_2+PbO \rightarrow Pb_{2.17}OCl_{2.34}$$

$PbCl_2$ and PbO were put in a mortar at a molar ratio of 1.17:1, mixed and ground carefully, and then transferred into a Φ400 mm×400 mm lidless corundum crucible and press it tight. The crucible was placed in a muffle furnace, slowly heated to 300° C., kept at this temperature for 24 hours, after cooling to room temperature, the mixture is loose in this moment, and then mixed and ground the sample uniformly, then placed into the crucible and loaded into a muffle furnace to 430° C. and kept 48 hours, then grounded to obtain the compound of lead oxychloride, the product was analyzed using X-ray diffraction.

Growing the $Pb_{2.17}OCl_{2.34}$ crystal by the Czochralski method from the stoichiometric melt:

The obtained $Pb_{2.17}OCl_{2.34}$ compounds were transferred into a Φ100 mm×100 mm lidless platinum crucible, heated to 590° C., and kept 49 hours, and obtain the mixed melt of lead oxychloride;

Preparing a lead oxychloride seed crystal: a part of the mixed melting melt as obtained was slowly cooled to room temperature at a rate of 8.1° C./h to obtain a lead oxychloride seed crystal by spontaneous crystallization;

placed a crucible containing the mixed melt into a crystal growth furnace, attached the seed crystal on a crystal rod, introduced the seed crystal into the crystal growing furnace from the top, preheated the seed crystal for 10 minutes, introduced the seed crystal to contact the solution surface of the mixed melting solution for remelting, kept at the temperature for 10 minutes, and cooled to 490° C. at a speed of 7.7° C./h;

Cooled the temperature of the mixture at a speed of 4° C./day while rotating the crystal rod at a rate of 44 rpm for growing crystal, drew the crystal at a rate of 2 mm/h, increased the drawing rate to draw the crystal out of the surface of the mixed melting solution when the crystal growth was finished, cooled to room temperature at a rate of 40° C./h, and took out the crystal from the furnace to obtain a lead oxychloride infrared nonlinear optical crystal with a size of 11 mm×10 mm×3 mm.

Example 5

Growing the crystal by the Czochralski method from the stoichiometric melt.

Preparing of $Pb_{2+x}OCl_{2+2x}$ (x=0.5) compound via solid reaction method according to the following reaction equation:

$$1.5PbCl_2+PbC_2O_4 \rightarrow Pb_{2.5}OCl_3+CO_2\uparrow+CO\uparrow$$

$PbCl_2$ and PbO were put in a mortar at a molar ratio of 1.5:1, mixed and ground carefully, and then transferred into a Φ400 mm×400 mm lidless corundum crucible and press it tight. The crucible was placed in a muffle furnace, slowly heated to 300° C., kept at this temperature for 24 hours, after cooling to room temperature, the mixture is loose in this moment, and then mixed and ground the sample uniformly, then placed into the crucible and loaded into a muffle furnace to 430° C. and kept 48 hours, then grounded to obtain the compound of lead oxychloride, the product was analyzed using X-ray diffraction.

Growing the $Pb_{2.5}OCl_3$ crystal by the Czochralski method from the stoichiometric melt:

The obtained $Pb_{2.5}OCl_3$ compounds were transferred into a Φ100 mm×100 mm lidless platinum crucible, heated to 580° C., and kept 52 hours, and obtain the mixed melt of lead oxychloride;

Preparing a lead oxychloride seed crystal: a part of the mixed melting melt as obtained was slowly cooled to room temperature at a rate of 7.8° C./h to obtain a lead oxychloride seed crystal by spontaneous crystallization;

Placed a crucible containing the mixed melt into a crystal growth furnace, attached the seed crystal on a crystal rod, introduced the seed crystal into the crystal growing furnace from the top, preheated the seed crystal for 12 minutes, introduced the seed crystal to contact the solution surface of the mixed melting solution for remelting, kept at the temperature for 12 minutes, and cooed to 480° C. at a speed of 7.5° C./h;

Cooled the temperature of the mixture at a speed of 3.7° C./day while rotating the crystal rod at a rate of 42 rpm for growing crystal, drew the crystal at a rate of 1.8 mm/h, increased the drawing rate to draw the crystal out of the surface of the mixed melting solution when the crystal growth is finished, cooled to room temperature at a rate of 38° C./h, and took out the crystal from the furnace to obtain a lead oxychloride infrared nonlinear optical crystal with a size of 18 mm×16 mm×4 mm.

Example 6

Growing the crystal by the Kyropoulos method from the stoichiometric melt.

Preparing of $Pb_{2.1}OCl_{2.2}$ compound via solid reaction method according to the following reaction equation:

$$1.1PbCl_2+PbC_2O_4 \rightarrow Pb_{2.1}OCl_{2.2}+CO_2\uparrow+CO\uparrow$$

The specific operation steps are carried out according to the example 1.

Growing $Pb_{2.1}OCl_{2.2}$ crystal by the Kyropoulos method from the stoichiometric melt.

The obtained $Pb_{2.1}OCl_{2.2}$ compounds were transferred into a Φ100 mm×100 mm lidless platinum crucible, heated to 600° C., and keeping 46 hours, and obtain the mixed melt of lead oxychloride;

Preparing a lead oxychloride seed crystal: a part of the mixed melting melt as obtained was slowly cooled to room temperature at a rate of 8.5° C./h to obtain a lead oxychloride seed crystal by spontaneous crystallization;

Placed a crucible containing the mixed melt into a crystal growth furnace, attached the $Pb_{2.1}OCl_{2.2}$ seed crystal that cut along c axis on bottom of a crystal rod, introduced the seed crystal into the crystal growing furnace from the hole in the top of furnace, preheated the seed crystal for 10 minutes, introduced the seed crystal to contact the solution surface of the mixed melting solution for remelting, kept at the temperature for 10 minutes, and cooled to 500° C. at a speed of 8° C./h;

Cooled the temperature of the mixture at a speed of 4.2° C./day while rotating the crystal rod at a rate of 40 rpm for growing crystal, drew the crystal out of the surface of the mixed melting solution when the crystal growth is finished, cooled to room temperature at a rate of 40° C./h, and took out the crystal from the furnace to obtain a $Pb_{2.1}OCl_{2.2}$ crystal with a size of 20 mm×15 mm×8 mm.

Example 7

Growing the crystal by the Kyropoulos method from the stoichiometric melt.

Preparing of $Pb_{2.125}OCl_{2.25}$ compound via solid reaction method according to the following reaction equation:

$$1.125PbCl_2+PbC_2O_4 \rightarrow Pb_{2.125}OCl_{2.25}+CO_2\uparrow+CO\uparrow$$

The specific operation steps are carried out according to the example 2.

Growing $Pb_{2.125}OCl_{2.25}$ crystal by the Kyropoulos method from the stoichiometric melt.

The obtained $Pb_{2.125}OCl_{2.25}$ compounds were transferred into a Φ100 mm×100 mm lidless platinum crucible, heated to 590° C., and kept 50 hours, and obtain the mixed melt of lead oxychloride;

Preparing a lead oxychloride seed crystal: a part of the mixed melting melt as obtained was slowly cooled to room temperature at a rate of 8° C./h to obtain a lead oxychloride seed crystal by spontaneous crystallization;

Placed a crucible containing the mixed melt into a crystal growth furnace, attached the $Pb_{2.125}OCl_{2.25}$ seed crystal that cut along c axis on bottom of a crystal rod, introduced the seed crystal into the crystal growing furnace from the hole in the top of furnace, preheated the seed crystal for 12 minutes, introduced the seed crystal to contact the solution surface of the mixed melting solution for remelting, kept at the temperature for 12 minutes, and cooled to 490° C. at a speed of 7° C./h;

Cooled the temperature of the mixture at a speed of 4° C./day while rotating the crystal rod at a rate of 37 rpm for growing crystal, drew the crystal out of the surface of the mixed melting solution when the crystal growth is finished, cooled to room temperature at a rate of 35° C./h, and took out the crystal from the furnace to obtain a $Pb_{2.125}OCl_{2.25}$ crystal with a size of 19 mm×12 mm×6 mm.

Example 8

Growing the crystal by the Kyropoulos method from the stoichiometric melt.

Preparing of $Pb_{2.15}OCl_{2.3}$ compound via solid reaction method according to the following reaction equation:

The specific operation steps are carried out according to the example 3.

Growing $Pb_{2.15}OCl_{2.3}$ crystal by the Kyropoulos method from the stoichiometric melt.

The obtained $Pb_{2.15}OCl_{2.3}$ compounds were transferred into a Φ100 mm×100 mm lidless platinum crucible, heated to 580° C., and keeping 52 hours, and obtain the mixed melt of lead oxychloride;

Preparing a lead oxychloride seed crystal: a part of the mixed melting melt as obtained was slowly cooled to room temperature at a rate of 7.5° C./h to obtain a lead oxychloride seed crystal by spontaneous crystallization;

Placed a crucible containing the mixed melt into a crystal growth furnace, attached the $Pb_{2.15}OCl_{2.3}$ seed crystal that cut along c axis on bottom of a crystal rod, introduced the seed crystal into the crystal growing furnace from the hole in the top of furnace, preheated the seed crystal for 15 minutes, introduced the seed crystal to contact the solution surface of the mixed melting solution for remelting, kept at the temperature for 15 minutes, and cooled to 485° C. at a speed of 6.5° C./h;

Cooled the temperature of the mixture at a speed of 3.7° C./day while rotating the crystal rod at a rate of 35 rpm for growing crystal, drew the crystal out of the surface of the mixed melting solution when the crystal growth is finished, cooled to room temperature at a rate of 30° C./h, and took out the crystal from the furnace to obtain a $Pb_{2.15}OCl_{2.3}$ crystal with a size of 15 mm×13 mm×4 mm.

Example 9

Growing the crystal by the Kyropoulos method from the stoichiometric melt.

Preparing of $Pb_{2.17}OCl_{2.34}$ compound via solid reaction method according to the following reaction equation:

$$1.17PbCl_2+Pb(CO_3)_2 \rightarrow Pb_{2.17}OCl_{2.34}+CO_2\uparrow$$

The specific operation steps are carried out according to the example 4.

Growing $Pb_{2.17}OCl_{2.34}$ crystal by the Kyropoulos method from the stoichiometric melt.

The obtained $Pb_{2.17}OCl_{2.34}$ compounds were transferred into a Φ100 mm×100 mm lidless platinum crucible, heated to 575° C., and keeping 54 hours, and obtain the mixed melt of lead oxychloride;

Preparing a lead oxychloride seed crystal: a part of the mixed melting melt as obtained was slowly cooled to room temperature at a rate of 7.1° C./h to obtain a lead oxychloride seed crystal by spontaneous crystallization;

Placed a crucible containing the mixed melt into a crystal growth furnace, attached the $Pb_{2.17}OCl_{2.34}$ seed crystal that cut along c axis on bottom of a crystal rod, introduced the seed crystal into the crystal growing furnace from the hole in the top of furnace, preheated the seed crystal for 17 minutes, introduced the seed crystal to contact the solution surface of the mixed melting solution for remelting, kept at the temperature for 17 minutes, and cooled to 480° C. at a speed of 6.1° C./h;

Cooled the temperature of the mixture at a speed of 3.2° C./day while rotating the crystal rod at a rate of 33 rpm for growing crystal, drew the crystal out of the surface of the mixed melting solution when the crystal growth is finished, cooled to room temperature at a rate of 28° C./h, and took out the crystal from the furnace to obtain a $Pb_{2.17}OCl_{2.34}$ crystal with a size of 18 mm×13 mm×6 mm.

Example 10

Growing the crystal by the Kyropoulos method from the stoichiometric melt.

Preparing of $Pb_{2.5}OCl_3$ compound via solid reaction method according to the following reaction equation:

The specific operation steps are carried out according to the example 5.

Growing $Pb_{2.5}OCl_3$ crystal by the Kyropoulos method from the stoichiometric melt.

The obtained $Pb_{2.5}OCl_3$ compounds were transferred into a Φ100 mm×100 mm lidless platinum crucible, heated to 560° C., and kept 60 hours, and obtain the mixed melt of lead oxychloride;

Preparing a lead oxychloride seed crystal: a part of the mixed melting melt as obtained was slowly cooled to room temperature at a rate of 6.5° C./h to obtain a lead oxychloride seed crystal by spontaneous crystallization;

Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 25 minutes, introduced the seed crystal to contact the solution surface of the mixed melting solution for remelting, kept at the temperature for 25 minutes, and cooled to 475° C. at a speed of 5° C./h;

Cooled the temperature of the mixture at a speed of 3° C./day while rotating the crystal rod at a rate of 30 rpm for growing crystal, drew the crystal out of the surface of the mixed melting solution when the crystal growth is finished, cooled to room temperature at a rate of 25° C./h, and took out the crystal from the furnace to obtain a $Pb_{2.5}OCl_3$ crystal with a size of 18 mm×10 mm×3 mm.

Example 11

Growing the crystal by the Bridgman method from the stoichiometric melt.

Preparing of $Pb_{2+x}OCl_{2+2x}$ (x=0.1) compound via solid reaction method according to the following reaction equation:

The specific operation steps are carried out according to the example 1.

Growing $Pb_{2.1}OCl_{2.2}$ crystal by the Bridgman method from the stoichiometric melt.

The obtained $Pb_{2.1}OCl_{2.2}$ compounds were transferred into a Φ50 mm×200 mm sealed quartz crucible, and placed into a Bridgman furnace;

The crucible was heated to 600° C., and held 45 hours, obtain the mixed melt of lead oxychloride. The crucible slowly decreased at a rate of 1.2 mm/hours to make the melt crystallized in the crucible, then crucible cooled to room temperature at a rate of 5° C./h. The crystal was slowly taken out from furnace to obtain lead oxychloride crystal with size of Φ40 mm×90 mm.

Example 12

Growing the crystal by the Bridgman method from the stoichiometric melt.

Preparing of $Pb_{2+x}OCl_{2+2x}$ (x=0.125) compound via solid reaction method according to the following reaction equation:

$$1.125PbCl_2+Pb(CO_3)_2 \rightarrow Pb_{2.125}OCl_{2.25}+CO_2\uparrow$$

The specific operation steps are carried out according to the example 2.

Growing $Pb_{2.125}OCl_{2.25}$ crystal by the Bridgman method from the stoichiometric melt.

The obtained $Pb_{2.125}OCl_{2.25}$ compounds were transferred into a Φ50 mm×200 mm sealed quartz crucible, and placed into a Bridgman furnace;

The crucible was heated to 580° C., and held 50 hours, obtain the mixed melt of lead oxychloride. The crucible slowly decreased at a rate of 1.5 mm/hours to make the melt crystallized in the crucible, then crucible cooled to room temperature at a rate of 5° C./h. The crystal was slowly taken out from furnace to obtain lead oxychloride crystal with size of Φ40 mm×80 mm.

Example 13

Growing the crystal by the Bridgman method from the stoichiometric melt.

Preparing of $Pb_{2+x}OCl_{2+2x}$ (x=0.15) compound via solid reaction method according to the following reaction equation:

$$1.15PbCl_2+Pb(NO_3)_2 \rightarrow Pb_{2.15}OCl_{2.3}+NO_2\uparrow$$

The specific operation steps are carried out according to the example 3.

Growing $Pb_{2.15}OCl_{2.3}$ crystal by the Bridgman method from the stoichiometric melt.

The obtained $Pb_{2.15}OCl_{2.3}$ compounds were transferred into a Φ50 mm×200 mm sealed quartz crucible, and placed into a Bridgman furnace;

The crucible was heated to 570° C., and held 60 hours, obtain the mixed melt of lead oxychloride. The crucible slowly decreased at a rate of 1.8 mm/hours to make the melt crystallized in the crucible, then crucible cooled to room temperature at a rate of 5° C./h. The crystal was slowly taken out from furnace to obtain lead oxychloride crystal with size of Φ40 mm×100 mm.

Example 14

Growing the crystal by the Bridgman method from the stoichiometric melt.

Preparing of $Pb_{2+x}OCl_{2+2x}$ (x=0.17) compound via solid reaction method according to the following reaction equation:

$$1.17PbCl_2+Pb(NO_3)_2 \rightarrow Pb_{2.17}OCl_{2.34}+NO_2\uparrow$$

The specific operation steps are carried out according to the example 4.

Growing $Pb_{2.17}OCl_{2.34}$ crystal by the Bridgman method from the stoichiometric melt.

The obtained $Pb_{2.17}OCl_{2.34}$ compounds were transferred into a Φ50 mm×200 mm sealed quartz crucible, and placed into a Bridgman furnace;

The crucible was heated to 565° C., and held 65 hours, obtain the mixed melt of lead oxychloride. The crucible slowly decreased at a rate of 1.5 mm/hours to make the melt crystallized in the crucible, then crucible cooled to room temperature at a rate of 5° C./h. The crystal was slowly taken out from furnace to obtain lead oxychloride crystal with size of Φ40 mm×110 mm.

Example 15

Growing the crystal by the Bridgman method from the stoichiometric melt.

Preparing of $Pb_{2+x}OCl_{2+2x}$ (x=0.5) compound via solid reaction method according to the following reaction equation:

$$1.5PbCl_2+Pb(NO_3)_2 \rightarrow Pb_{2.5}OCl_3+NO_2\uparrow$$

The specific operation steps are carried out according to the example 5.

Growing $Pb_{2.5}OCl_3$ crystal by the Bridgman method from the stoichiometric melt.

The obtained $Pb_{2.5}OCl_3$ compounds were transferred into a Φ50 mm×200 mm sealed quartz crucible, and placed into a Bridgman furnace;

The crucible was heated to 560° C., and held 60 hours, obtain the mixed melt of lead oxychloride. The crucible slowly decreased at a rate of 2.0 mm/hours to make the melt crystallized in the crucible, then crucible cooled to room temperature at a rate of 5° C./h. The crystal was slowly taken out from furnace to obtain lead oxychloride crystal with size of Φ40 mm×100 mm.

Example 16

Growing the crystal by the flux method.

Preparing of $Pb_{2.1}OCl_{2.2}$ compound via solid reaction method according to the following reaction equation:

$$1.1PbCl_2+PbO \rightarrow Pb_{2.1}OCl_{2.2}$$

The specific operation steps are carried out according to the example 1.

Growing $Pb_{2.1}OCl_{2.2}$ crystal by the flux method.

Mixed the as obtained $Pb_{2.1}OCl_{2.2}$ compound and $PbCl_2$ flux with a molar ratio of 1:0.1, and loaded into a Φ100 mm×100 mm lidless platinum crucible, heated to melt, then increased to 580° C., and kept 50 hours, and obtain the mixed melt of lead oxychloride;

Preparing a lead oxychloride seed crystal: a part of the mixed melting solution as obtained was slowly cooled to room temperature at a rate of 7.5° C./h to obtain a lead oxychloride seed crystal by spontaneous crystallization;

Placed a crucible containing the mixed melt into a crystal growth furnace, attached the $Pb_{2.1}OCl_{2.2}$ seed crystal that cut along c axis on bottom of a crystal rod, introduced the seed crystal into the crystal growing furnace from the hole in the top of furnace, preheated the seed crystal for 30 minutes, introduced the seed crystal to contact the solution surface of the mixed melting solution for remelting, kept at the temperature for 30 minutes, and cooled to 530° C. at a speed of 30° C./h;

Cooled the temperature of the mixture at a speed of 0.5° C./day while rotating the crystal rod at a rate of 50 rpm for growing crystal, drew the crystal out of the surface of the mixed melting solution when the crystal growth is finished, cooled to room temperature at a rate of 40° C./h, and took out the crystal from the furnace to obtain a $Pb_{2.1}OCl_{2.2}$ crystal with a size of 18 mm×12 mm×6 mm.

Example 17

Growing the crystal by the flux method.
Preparing of $Pb_{2.125}OCl_{2.25}$ compound via solid reaction method according to the following reaction equation:

$$1.125PbCl_2+PbO \rightarrow Pb_{2.125}OCl_{2.25}$$

The specific operation steps are carried out according to the example 2.

Growing $Pb_{2.125}OCl_{2.25}$ crystal by the flux method.

Mixed the as obtained $Pb_{2.125}OCl_{2.25}$ compound and $PbCl_2$ flux with a molar ratio of 1:0.2, and loaded into a Φ100 mm×100 mm lidless platinum crucible, heated to melt, then increased to 570° C., and kept 55 hours, and obtain the mixed melt of lead oxychloride;

Preparing a lead oxychloride seed crystal: a part of the mixed melting solution as obtained was slowly cooled to room temperature at a rate of 7° C./h to obtain a lead oxychloride seed crystal by spontaneous crystallization;

Placed a crucible containing the mixed melt into a crystal growth furnace, attached the $Pb_{2.125}OCl_{2.25}$ seed crystal that cut along c axis on bottom of a crystal rod, introduced the seed crystal into the crystal growing furnace from the hole in the top of furnace, preheated the seed crystal for 35 minutes, introduced the seed crystal to contact the solution surface of the mixed melting solution for remelting, kept at the temperature for 35 minutes, and cooled to 520° C. at a speed of 27° C./h;

Cooled the temperature of the mixture at a speed of 0.45° C./day while rotating the crystal rod at a rate of 45 rpm for growing crystal, drew the crystal out of the surface of the mixed melting solution when the crystal growth is finished, cooled to room temperature at a rate of 38° C./h, and took out the crystal from the furnace to obtain a $Pb_{2.125}OCl_{2.25}$ crystal with a size of Φ7 mm×11 mm×5 mm.

Example 18

Growing the crystal by the flux method.
Preparing of $Pb_{2.15}OCl_{2.3}$ compound via solid reaction method according to the following reaction equation:

$$1.15PbCl_2+PbO \rightarrow Pb_{2.15}OCl_{2.3}+CO_2\uparrow+CO\uparrow$$

The specific operation steps are carried out according to the example 3.

Growing $Pb_{2.15}OCl_{2.3}$ crystal by the flux method.

Mixed the as obtained $Pb_{2.15}OCl_{2.3}$ compound and $PbCl_2$ flux with a molar ratio of 1:0.3, and loaded into a Φ100 mm×100 mm lidless platinum crucible, heated to melt, then increased to 550° C., and kept 60 hours, and obtain the mixed melt of lead oxychloride;

Preparing a lead oxychloride seed crystal: a part of the mixed melting solution as obtained was slowly cooled to room temperature at a rate of 6.8° C./h to obtain a lead oxychloride seed crystal by spontaneous crystallization;

Placed a crucible containing the mixed melt into a crystal growth furnace, attached the $Pb_{2.15}OCl_{2.3}$ seed crystal that cut along c axis on bottom of a crystal rod, introduced the seed crystal into the crystal growing furnace from the hole in the top of furnace, preheated the seed crystal for 37 minutes, introduced the seed crystal to contact the solution surface of the mixed melting solution for remelting, kept at the temperature for 37 minutes, and cooled to 515° C. at a speed of 25° C./h;

Cooled the temperature of the mixture at a speed of 0.4° C./day while rotating the crystal rod at a rate of 42 rpm for growing crystal, drew the crystal out of the surface of the mixed melting solution when the crystal growth is finished, cooled to room temperature at a rate of 36° C./h, and took out the crystal from the furnace to obtain a $Pb_{2.17}OCl_{2.34}$ crystal with a size of Φ6 mm×10 mm×7 mm.

Example 19

Growing the crystal by the flux method.
Preparing of $Pb_{2.17}OCl_{2.34}$ compound via solid reaction method according to the following reaction equation:

$$1.17PbCl_2+PbO \rightarrow Pb_{2.17}OCl_{2.34}$$

The specific operation steps are carried out according to the example 4.

Growing $Pb_{2.17}OCl_{2.34}$ crystal by the flux method.

Mixed the as obtained $Pb_{2.17}OCl_{2.34}$ compound and $PbCl_2$ flux with a molar ratio of 1:0.4, and loaded into a Φ100 mm×100 mm lidless platinum crucible, heated to melt, then increased to 551° C., and kept 62 hours, and obtain the mixed melt of lead oxychloride;

Preparing a lead oxychloride seed crystal: a part of the mixed melting solution as obtained was slowly cooled to room temperature at a rate of 6.4° C./h to obtain a lead oxychloride seed crystal by spontaneous crystallization;

Placed a crucible containing the mixed melt into a crystal growth furnace, attached the $Pb_{2.17}OCl_{2.34}$ seed crystal that cut along c axis on bottom of a crystal rod, introduced the seed crystal into the crystal growing furnace from the hole in the top of furnace, preheated the seed crystal for 41 minutes, introduced the seed crystal to contact the solution surface of the mixed melting solution for remelting, kept at the temperature for 41 minutes, and cooled to 505° C. at a speed of 22° C./h;

Cooled the temperature of the mixture at a speed of 0.37° C./day while rotating the crystal rod at a rate of 40 rpm for growing crystal, drew the crystal out of the surface of the mixed melting solution when the crystal growth is finished, cooled to room temperature at a rate of 34° C./h, and took out the crystal from the furnace to obtain a $Pb_{2.17}OCl_{2.34}$ crystal with a size of Φ8 mm×10 mm×6 mm.

Example 20

Growing the crystal by the flux method.
Preparing of $Pb_{2.5}OCl_3$ compound via solid reaction method according to the following reaction equation:

$$1.5PbCl_2+PbC_2O_4 \rightarrow Pb_{2.5}OCl_3+CO_2\uparrow+CO\uparrow$$

The specific operation steps are carried out according to the example 5.

Growing $Pb_{2.5}OCl_3$ crystal by the flux method.

Mixed the as obtained $Pb_{2.5}OCl_3$ compound and $PbCl_2$ flux with a molar ratio of 1:0.5, and loaded into a Φ100 mm×100 mm lidless platinum crucible, heated to melt, then increased to 550° C., and kept 63 hours, and obtain the mixed melt of lead oxychloride;

Preparing a lead oxychloride seed crystal: a part of the mixed melting solution as obtained was slowly cooled to room temperature at a rate of 6° C./h to obtain a lead oxychloride seed crystal by spontaneous crystallization;

Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 44 minutes, introduced the seed crystal to contact the solution surface of the mixed melting solution for remelting, kept at the temperature for 44 minutes, and cooled to 496° C. at a speed of 20° C./h;

Cooled the temperature of the mixture at a speed of 0.33° C./day while rotating the crystal rod at a rate of 60 rpm for growing crystal, drew the crystal out of the surface of the mixed melting solution when the crystal growth is finished, cooled to room temperature at a rate of 30° C./h, and took out the crystal from the furnace to obtain a $Pb_{2.5}OCl_3$ crystal with a size of 13 mm×12 mm×7 mm.

Example 21

Growing the crystal by the flux method.
Preparing of $Pb_{2.1}OCl_{2.2}$ compound via solid reaction method according to the following reaction equation:

The specific operation steps are carried out according to the example 1.

Growing $Pb_{2.1}OCl_{2.2}$ crystal by the flux method.

Mixed the as obtained $Pb_{2.1}OCl_{2.2}$ compound and $PbCl_2$ flux with a molar ratio of 1:0.8, and loaded into a Φ100 mm×100 mm lidless platinum crucible, heated to melt, then increased to 590° C., and kept 45 hours, and obtain the mixed melt of lead oxychloride;

Preparing a lead oxychloride seed crystal: a part of the mixed melting solution as obtained was slowly cooled to room temperature at a rate of 8° C./h to obtain a lead oxychloride seed crystal by spontaneous crystallization;

Placed a crucible containing the mixed melt into a crystal growth furnace, attached the $Pb_{2.1}OCl_{2.2}$ seed crystal that cut along c axis on bottom of a crystal rod, introduced the seed crystal into the crystal growing furnace from the hole in the top of furnace, preheated the seed crystal for 25 minutes, introduced the seed crystal to contact the solution surface of the mixed melting solution for remelting, kept at the temperature for 25 minutes, and cooled to 530° C. at a speed of 30° C./h;

Cooled the temperature of the mixture at a speed of 3° C./day while rotating the crystal rod at a rate of 55 rpm for growing crystal, drew the crystal out of the surface of the mixed melting solution when the crystal growth is finished, cooled to room temperature at a rate of 45° C./h, and took out the crystal from the furnace to obtain a $Pb_{2.1}OCl_{2.2}$ crystal with a size of 20 mm×17 mm×7 mm.

Example 22

Growing the crystal by the flux method.
Preparing of $Pb_{2.125}OCl_{2.25}$ compound via solid reaction method according to the following reaction equation:

The specific operation steps are carried out according to the example 2.

Growing $Pb_{2.125}OCl_{2.25}$ crystal by the flux method.

Mixed the as obtained $Pb_{2.125}OCl_{2.25}$ compound and $PbCl_2$ flux with a molar ratio of 1:1, and loaded into a Φ100 mm×100 mm lidless platinum crucible, heated to melt, then increased to 580° C., and kept 48 hours, and obtain the mixed melt of lead oxychloride;

Preparing a lead oxychloride seed crystal: a part of the mixed melting solution as obtained was slowly cooled to room temperature at a rate of 7.5° C./h to obtain a lead oxychloride seed crystal by spontaneous crystallization;

Placed a crucible containing the mixed melt into a crystal growth furnace, attached the $Pb_{2.125}OCl_{2.25}$ seed crystal that cut along c axis on bottom of a crystal rod, introduced the seed crystal into the crystal growing furnace from the hole in the top of furnace, preheated the seed crystal for 28 minutes, introduced the seed crystal to contact the solution surface of the mixed melting solution for remelting, kept at the temperature for 28 minutes, and cooled to 525° C. at a speed of 28° C./h;

Cooled the temperature of the mixture at a speed of 2.8° C./day while rotating the crystal rod at a rate of 48 rpm for growing crystal, drew the crystal out of the surface of the mixed melting solution when the crystal growth is finished, cooled to room temperature at a rate of 41° C./h, and took out the crystal from the furnace to obtain a $Pb_{2.125}OCl_{2.25}$ crystal with a size of Φ8 mm×16 mm×7 mm.

Example 23

Growing the crystal by the flux method.
Preparing of $Pb_{2.15}OCl_{2.3}$ compound via solid reaction method according to the following reaction equation:

The specific operation steps are carried out according to the example 3.

Growing $Pb_{2.15}OCl_{2.3}$ crystal by the flux method.

Mixed the as obtained $Pb_{2.15}OCl_{2.3}$ compound and $PbCl_2$ flux with a molar ratio of 1:2, and loaded into a Φ100 mm×100 mm lidless platinum crucible, heated to melt, then increased to 570° C., and kept 52 hours, and obtain the mixed melt of lead oxychloride;

Preparing a lead oxychloride seed crystal: a part of the mixed melting solution as obtained was slowly cooled to room temperature at a rate of 7.1° C./h to obtain a lead oxychloride seed crystal by spontaneous crystallization;

Placed a crucible containing the mixed melt into a crystal growth furnace, attached the $Pb_{2.15}OCl_{2.3}$ seed crystal that cut along c axis on bottom of a crystal rod, introduced the seed crystal into the crystal growing furnace from the hole in the top of furnace, preheated the seed crystal for 30 minutes, introduced the seed crystal to contact the solution surface of the mixed melting solution for remelting, kept at the temperature for 30 minutes, and cooled to 520° C. at a speed of 25° C./h;

Cooled the temperature of the mixture at a speed of 2.5° C./day while rotating the crystal rod at a rate of 42 rpm for growing crystal, drew the crystal out of the surface of the mixed melting solution when the crystal growth is finished, cooled to room temperature at a rate of 35° C./h, and took out the crystal from the furnace to obtain a $Pb_{2.15}OCl_{2.3}$ crystal with a size of 17 mm×12 mm×5 mm.

Example 24

Growing the crystal by the flux method.
Preparing of $Pb_{2.17}OCl_{2.34}$ compound via solid reaction method according to the following reaction equation:

The specific operation steps are carried out according to the example 4.

Growing $Pb_{2.17}OCl_{2.34}$ crystal by the flux method.

Mixed the as obtained $Pb_{2.17}OCl_{2.34}$ compound and PbO flux with a molar ratio of 1:1.3, and loaded into a Φ100 mm×100 mm lidless platinum crucible, heated to melt, then increased to 560° C., and kept 55 hours, and obtain the mixed melt of lead oxychloride;

Preparing a lead oxychloride seed crystal: a part of the mixed melting solution as obtained was slowly cooled to room temperature at a rate of 6.6° C./h to obtain a lead oxychloride seed crystal by spontaneous crystallization;

Placed a crucible containing the mixed melt into a crystal growth furnace, attached the $Pb_{2.17}OCl_{2.34}$ seed crystal that cut along c axis on bottom of a crystal rod, introduced the seed crystal into the crystal growing furnace from the hole in the top of furnace, preheated the seed crystal for 33 minutes, introduced the seed crystal to contact the solution surface of the mixed melting solution for remelting, kept at the temperature for 33 minutes, and cooled to 515° C. at a speed of 23° C./h;

Cooled the temperature of the mixture at a speed of 2.1° C./day while rotating the crystal rod at a rate of 38 rpm for growing crystal, drew the crystal out of the surface of the mixed melting solution when the crystal growth is finished, cooled to room temperature at a rate of 32° C./h, and took out the crystal from the furnace to obtain a $Pb_{2.17}OCl_{2.34}$ crystal with a size of 20 mm×16 mm×5 mm.

Example 25

Growing the crystal by the flux method.

Preparing of $Pb_{2.5}OCl_3$ compound via solid reaction method according to the following reaction equation:

$$1.5PbCl_2+Pb(CO_3)_2 \rightarrow Pb_{2.5}OCl_3+CO_2\uparrow$$

The specific operation steps are carried out according to the example 5.

Growing $Pb_{2.5}OCl_3$ crystal by the flux method.

Mixed the as obtained $Pb_{2.5}OCl_3$ compound and PbO flux with a molar ratio of 1:1.5, and loaded into a Φ100 mm×100 mm lidless platinum crucible, heated to melt, then increased to 550° C., and kept 57 hours, and obtain the mixed melt of lead oxychloride;

Preparing a lead oxychloride seed crystal: a part of the mixed melting solution as obtained was slowly cooled to room temperature at a rate of 6.3° C./h to obtain a lead oxychloride seed crystal by spontaneous crystallization;

Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 37 minutes, introduced the seed crystal to contact the solution surface of the mixed melting solution for remelting, kept at the temperature for 37 minutes, and cooled to 511° C. at a speed of 20° C./h;

Cooled the temperature of the mixture at a speed of 1.7° C./day while rotating the crystal rod at a rate of 36 rpm for growing crystal, drew the crystal out of the surface of the mixed melting solution when the crystal growth is finished, cooled to room temperature at a rate of 29° C./h, and took out the crystal from the furnace to obtain a $Pb_{2.5}OCl_3$ crystal with a size of Φ9 mm×13 mm×5 mm.

Example 26

Growing the crystal by the flux method.

Preparing of $Pb_{2.5}OCl_3$ compound via solid reaction method according to the following reaction equation:

$$1.5PbCl_2+Pb(CO_3)_2 \rightarrow Pb_{2.5}OCl_3+CO_2\uparrow$$

The specific operation steps are carried out according to the example 5.

Growing $Pb_{2.5}OCl_3$ crystal by the flux method.

Mixed the as obtained $Pb_{2.5}OCl_3$ compound and PbO flux with a molar ratio of 1:2, and loaded into a Φ100 mm×100 mm lidless platinum crucible, heated to melt, then increased to 540° C., and kept 60 hours, and obtain the mixed melt of lead oxychloride;

Preparing a lead oxychloride seed crystal: a part of the mixed melting solution as obtained was slowly cooled to room temperature at a rate of 5.8° C./h to obtain a lead oxychloride seed crystal by spontaneous crystallization;

Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 39 minutes, introduced the seed crystal to contact the solution surface of the mixed melting solution for remelting, kept at the temperature for 29 minutes, and cooled to 508° C. at a speed of 18° C./h;

Cooled the temperature of the mixture at a speed of 1.3° C./day while rotating the crystal rod at a rate of 32 rpm for growing crystal, drew the crystal out of the surface of the mixed melting solution when the crystal growth is finished, cooled to room temperature at a rate of 24° C./h, and took out the crystal from the furnace to obtain a $Pb_{2.5}OCl_3$ crystal with a size of Φ9 mm×13 mm×5 mm.

Example 27

Growing the crystal by the flux method.

Preparing of $Pb_{2.5}OCl_3$ compound via solid reaction method according to the following reaction equation:

$$1.5PbCl_2+Pb(CO_3)_2 \rightarrow Pb_{2.5}OCl_3+CO_2\uparrow$$

The specific operation steps are carried out according to the example 5.

Growing $Pb_{2.5}OCl_3$ crystal by the flux method.

Mixed the as obtained $Pb_{2.5}OCl_3$ compound and PbO flux with a molar ratio of 1:0.1, and loaded into a Φ100 mm×100 mm lidless platinum crucible, heated to melt, then increased to 535° C., and kept 64 hours, and obtain the mixed melt of lead oxychloride;

Preparing a lead oxychloride seed crystal: a part of the mixed melting solution as obtained was slowly cooled to room temperature at a rate of 5.2° C./h to obtain a lead oxychloride seed crystal by spontaneous crystallization;

Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 42 minutes, introduced the seed crystal to contact the solution surface of the mixed melting solution for remelting, kept at the temperature for 42 minutes, and cooled to 495° C. at a speed of 15° C./h;

Cooled the temperature of the mixture at a speed of 1.1° C./day while rotating the crystal rod at a rate of 29 rpm for growing crystal, drew the crystal out of the surface of the mixed melting solution when the crystal growth is finished, cooled to room temperature at a rate of 20° C./h, and took out the crystal from the furnace to obtain a $Pb_{2.5}OCl_3$ crystal with a size of Φ9 mm×13 mm×5 mm.

Example 28

Growing the crystal by the flux method.
Preparing of $Pb_{2.5}OCl_3$ compound via solid reaction method according to the following reaction equation:

The specific operation steps are carried out according to the example 5.
Growing $Pb_{2.5}OCl_3$ crystal by the flux method.
Mixed the as obtained $Pb_{2.5}OCl_3$ compound and PbO flux with a molar ratio of 1:0.5, and loaded into a Φ100 mm×100 mm lidless platinum crucible, heated to melt, then increased to 530° C., and kept 66 hours, and obtain the mixed melt of lead oxychloride;
Preparing a lead oxychloride seed crystal: a part of the mixed melting solution as obtained was slowly cooled to room temperature at a rate of 4.5° C./h to obtain a lead oxychloride seed crystal by spontaneous crystallization;
Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 50 minutes, introduced the seed crystal to contact the solution surface of the mixed melting solution for remelting, kept at the temperature for 50 minutes, and cooled to 485° C. at a speed of 15° C./h;
Cooled the temperature of the mixture at a speed of 0.9° C./day while rotating the crystal rod at a rate of 25 rpm for growing crystal, drew the crystal out of the surface of the mixed melting solution when the crystal growth is finished, cooled to room temperature at a rate of 15° C./h, and took out the crystal from the furnace to obtain a $Pb_{2.5}OCl_3$ crystal with a size of 19 mm×13 mm×5 mm.

Example 29

Growing the crystal by the flux method.
Preparing of $Pb_{2.5}OCl_3$ compound via solid reaction method according to the following reaction equation:

The specific operation steps are carried out according to the example 5.
Growing $Pb_{2.5}OCl_3$ crystal by the flux method.
Mixed the as obtained $Pb_{2.5}OCl_3$ compound and PbO flux with a molar ratio of 1:1, and loaded into a Φ100 mm×100 mm lidless platinum crucible, heated to melt, then increased to 520° C., and kept 70 hours, and obtain the mixed melt of lead oxychloride;
Preparing a lead oxychloride seed crystal: a part of the mixed melting solution as obtained was slowly cooled to room temperature at a rate of 4.1° C./h to obtain a lead oxychloride seed crystal by spontaneous crystallization;
Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 54 minutes, introduced the seed crystal to contact the solution surface of the mixed melting solution for remelting, kept at the temperature for 54 minutes, and cooled to 465° C. at a speed of 13° C./h;
Cooled the temperature of the mixture at a speed of 0.6° C./day while rotating the crystal rod at a rate of 21 rpm for growing crystal, drew the crystal out of the surface of the mixed melting solution when the crystal growth is finished, cooled to room temperature at a rate of 10° C./h, and took out the crystal from the furnace to obtain a $Pb_{2.5}OCl_3$ crystal with a size of 19 mm×13 mm×5 mm.

Example 30

Growing the crystal by the flux method.
Preparing of $Pb_{2.5}OCl_3$ compound via solid reaction method according to the following reaction equation:

The specific operation steps are carried out according to the example 5.
Growing $Pb_{2.5}OCl_3$ crystal by the flux method.
Mixed the as obtained $Pb_{2.5}OCl_3$ compound and PbO flux with a molar ratio of 1:2, and loaded into a Φ100 mm×100 mm lidless platinum crucible, heated to melt, then increased to 450° C., and kept 80 hours, and obtain the mixed melt of lead oxychloride;
Preparing a lead oxychloride seed crystal: a part of the mixed melting solution as obtained was slowly cooled to room temperature at a rate of 0.5° C./h to obtain a lead oxychloride seed crystal by spontaneous crystallization;
Placed a crucible containing the mixed melt into a crystal growth furnace, attached the $Pb_{2.5}OCl_3$ seed crystal that cut along c axis on bottom of a crystal rod, introduced the seed crystal into the crystal growing furnace from the hole in the top of furnace, preheated the seed crystal for 60 minutes, introduced the seed crystal to contact the solution surface of the mixed melting solution for remelting, kept at the temperature for 60 minutes, and cooled to 350° C. at a speed of 10° C./h;
Cooled the temperature of the mixture at a speed of 0.1° C./day while rotating the crystal rod at a rate of 0 rpm for growing crystal, drew the crystal out of the surface of the mixed melting solution when the crystal growth is finished, cooled to room temperature at a rate of 1° C./h, and took out the crystal from the furnace to obtain a $Pb_{2.5}OCl_3$ crystal with a size of 19 mm×13 mm×5 mm.

Example 31

Figure 1:
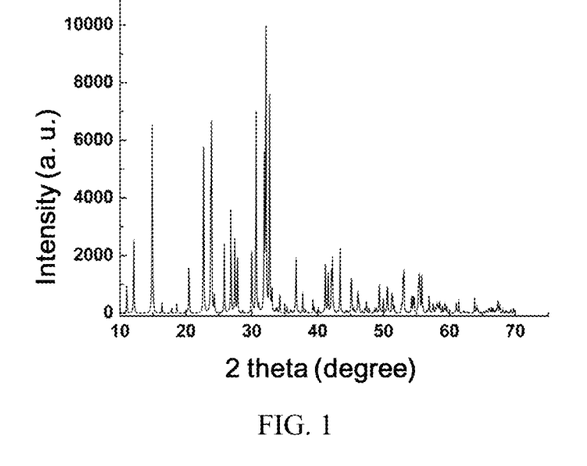
FIG. 1 shows the X-ray diffraction pattern of lead oxychloride $Pb_{2+x}OCl_{2+2x}$, and 0<x<0.139 or 0.141<x<0.159 or 0.161<x≤0.6.
Figure 2:
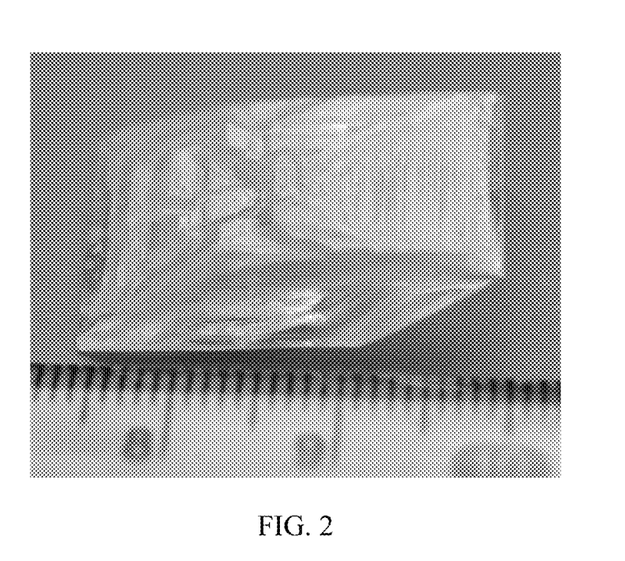
FIG. 2 shows the crystal photo of lead oxychloride $Pb_{2+x}OCl_{2+2x}$, and 0<x<0.139 or 0.141<x<0.159 or 0.161<x≤0.6.
Figure 3:
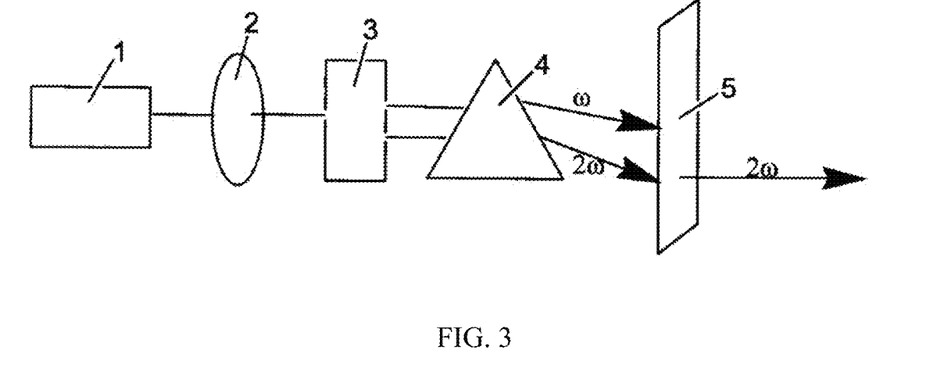
FIG. 3 is a schematic illustration of the processing principles of a nonlinear optical device made from the present lead oxychloride $Pb_{2+x}OCl_{2+2x}$, and 0<x<0.139 or 0.141<x<0.159 or 0.161<x≤0.6, wherein, 1 is a laser generator, 2 is an emitted laser beam, 3 is a $Pb_{2+x}OCl_{2+2x}$ crystal, and 0<x<0.139 or 0.141<x<0.159 or 0.161<x≤0.6, 4 is an output beam, and 5 is a filter.

A lead oxychloride crystal obtained in any one of Examples 1-30 was processed into a second harmonic device with size of 5 mm×5 mm×5 mm according to the phase-matching orientation, and disposed at position 3 as shown in FIG. 3. At room temperature, when Q-switched Nd:YAG laser generator was used as the light resource and the incident light is 1064 nm, an infrared light beam 2 with a wavelength of 1064 nm generated by the Q-switched Nd:YAG laser generator 1 irradiated into the lead oxychloride crystal 3, resulting in a green second harmonic light with an output intensity of 4 times of KDP under same condition. The output light beam 4 contained an infrared light with a wavelength of 1064 nm and a green light with a wavelength of 532 nm, and it was filtered by filter 5 to obtain a green laser with a wavelength of 532 nm.

What is claimed is:
1. A lead oxychloride infrared nonlinear optical crystal having a formula of $Pb_{2+x}OCl_{2+2x}$, wherein $0<x<0.139$ or

$0.141 < x < 0.159$ or $0.161 < x \leq 0.6$, and the crystal has no symmetric center, belongs to an orthonormal system with a space group of Fmm2, and cell parameter is $a=35.4963(14) \pm 0.05$ Å, $b=5.8320(2) \pm 0.05$ Å, $c=16.0912(6) \pm 0.05$ Å.

2. A method for preparing the lead oxychloride infrared nonlinear optical crystal of claim 1, comprising:

synthesizing a compound by using a solid state reaction method first, and then growing a crystal by high temperature melt method or flux method, and the specific operation is carried out according to the following steps:

a. mixing and grinding $PbCl_2$ and PbO, $Pb(CO_3)_2$ or $Pb(NO3)_2$ in a mortar, then transferring the grinded mixture into an $Al_2O_3$ crucible with a size of Φ400 mm×400 mm, pressing the mixture in the crucible and putting into a muffle furnace, slowly heating to 300° C. and keeping at this temperature for 24 hours, cooling at a room temperature to form the mixture loose, and then grinding the mixture uniformly, then putting the mixture into a muffle furnace at 430° C. and kept for 48 hours, then grinding to obtain a lead oxychloride compound, which is identified by X-ray diffraction;

b. melting the lead oxychloride compound obtained in step a in the crucible, heating to 450-650° C., and keeping for 5-80 hours to obtain a mixed melt of lead oxychloride;

or introducing fluxes of $PbCl_2$ or PbO into the lead oxychloride compound obtained in step a to form a resulted mixture, and heating the resulted mixture to 450-650° C., and keeping the resulted mixture for 5-80 hours to obtain a solution of lead chlorate and fluxes, wherein a molar ratio of lead chlorate and fluxes is 1:0.1-2;

c. preparing a lead oxychloride seed crystal: a part of the mixed melting melt or solution obtained in step b is slowly cooled to the room temperature at a rate of 0.5-10° C./h to obtain a lead oxychloride seed crystal by spontaneous crystallization;

d. placing a crucible containing the mixed melt or solution as obtained in step b into a crystal growth furnace, and attaching the seed crystal obtained in step c on a crystal rod, and introducing a seed crystal into the crystal growing furnace from the top, and preheating for 5-60 minutes, introducing to contact the solution surface of the mixed melting solution or into the mixed melt for remelting, and keeping at the temperature for 5-60 minutes, and cooling to 350-510° C. at a speed of 1-60° C./h;

e. cooling the mixture at a speed of 0.1-5° C./day while the crystal rod is being rotated at a rate of 0~60 rpm for growing crystal, and the crystal is drawn out from the surface of the mixed melting solution when a predetermined size single crystal is obtained, and cooling to the room temperature at a rate of 1~80° C./h, and taking from the furnace to obtain a lead oxychloride infrared nonlinear optical crystal.

3. The method according to claim 2, wherein the high temperature melt method includes Czochralski method, kyropoulos method or Bridgman method.

4. A method of using the lead oxychloride infrared nonlinear optical crystal according to claim 1, wherein using the oxychloride infrared nonlinear optical crystal to prepare a second harmonic generator, an up frequency converter, a down frequency convertor, an optical parametric oscillator, a photorefractive information processor, electro-optic modulator or optical lens.

5. The lead oxychloride infrared nonlinear optical crystal of claim 1, wherein $0 < x < 0.139$.

6. The lead oxychloride infrared nonlinear optical crystal of claim 1, wherein $0.141 < x < 0.159$.

7. The lead oxychloride infrared nonlinear optical crystal of claim 1, wherein $0.161 < x \geq 0.6$.

* * * * *